United States Patent [19]
Herrmann

[11] 3,956,035
[45] May 11, 1976

[54] PLANAR DIFFUSION PROCESS FOR MANUFACTURING MONOLITHIC INTEGRATED CIRCUITS

[76] Inventor: Hans Herrmann, Heinrich-Heine-Strasse 9, D-783 Emmendingen, Germany

[22] Filed: Oct. 1, 1974

[21] Appl. No.: 510,929

[30] Foreign Application Priority Data
Oct. 17, 1973   Germany............................ 2351985

[52] U.S. Cl. ............................ 148/175; 29/576 E; 148/191; 357/44; 357/48
[51] Int. Cl.² ................... H01L 21/76; H01L 21/20
[58] Field of Search................ 148/175, 187, 191; 357/48, 44; 29/576

[56] References Cited
UNITED STATES PATENTS

| | | |
|---|---|---|
| 3,595,713 | 7/1971 | De Brebisson et al............. 148/175 |
| 3,595,714 | 7/1971 | Thire et al......................... 148/175 |
| 3,607,465 | 9/1971 | Frouin ................................ 148/175 |
| 3,622,842 | 11/1971 | Oberal ............................. 357/48 X |
| 3,767,486 | 10/1973 | Imaizumi ........................... 148/175 |

FOREIGN PATENTS OR APPLICATIONS
1,510,057   12/1967   France.................................. 317/48

*Primary Examiner*—L. Dewayne Rutledge
*Assistant Examiner*—W. G. Saba

[57] ABSTRACT

This relates to a process for manufacturing monolithic integrated circuits comprising at least one pair of complementary bipolar planar transistors. The pair of transistors, having two buried layers and two superimposed epitaxially deposited layers upon a semiconductor substrate body, are manufactured by deposition of an epitaxial layer having a thickness wherein the base zone of the pnp-transistor remains and is surrounded by a p-conducting zone which is diffused during the diffusion of the base zone of the npn-transistor and a portion of an insulating zone.

1 Claim, 9 Drawing Figures

PLANAR DIFFUSION PROCESS FOR MANUFACTURING MONOLITHIC INTEGRATED CIRCUITS

BACKGROUND OF THE INVENTION

The present invention relates to a planar diffusion process for manufacturing monolithic integrated circuits comprising at least one pair of complementary bipolar planar transistor components, i.e. comprising at least one planar pnp-transistor and at least one npn-transistor.

In "IEEE Journal of Solid-State Circuits" (April 1972), pp. 170/171, two different processes for manufacturing bipolar complementary structures are described, each comprising a pair of non-lateral planar transistor components. The present invention proceeds from such bipolar complementary structures comprising non-lateral planar transistor components, because the electrical properties thereof can be better adapted to one another than in the case of a bipolar complementary structure comprising a lateral planar transistor. In describing the invention, brief reference is made to the planar diffusion methods of the two processes, namely of the complementary Standard process and of the complementary Stanford process.

The disadvantages of the aforementioned processes are partly overcome by a planar diffusion process described by R. G. Donald in the journal "Solid-State Electronics", Vol. 13, (1970), pp. 815 to 824, and which hereinafter is referred to as the Donald process. This planar diffusion process too, has certain disadvantages with respect to the breakdown voltages of the planar transistor components and the tolerances of diffused resistance elements with squeezed resistance zones which are required for realizing a monolithic integrated (solid-state) circuit. These disadvantages will be referred to in detail hereinafter. The invention proceeds from the planar diffusion method of the Donald process.

SUMMARY OF THE INVENTION

It is an object of the present invention to provide a planar diffusion process which avoids the disadvantages of the Donald process.

According to a broad aspect of the invention there is provided a planar diffusion process for manufacturing a monolithic integrated circuit including at least one npn-transistor and at least one pnp-transistor, wherein there are provided highly doped n-conducting intermediate layers between an n-conducting epitaxial layer consisting of two partial layers successively deposited upon a p-conducting substrate body, and the substrate body below at least one bipolar pnp-transistor component within the epitaxial layer, which between the transistor components is traversed by a p-type insulating zone which is diffused by an out-diffusion from a sub-insulating diffusion zone superficially disposed on the first partial layer together with a sub-collector diffusion serving to establish a sub-collector zone at the pnp-transistor, comprising: depositing a second partial layer of said epitaxial layer having a thickness such that a layer of said second partial layer, remaining unchanged in conductivity type, has a depth equal to the desired base zone depth of said pnp-transistor after all temperature treatments connected with diffusion processes have been carried out; and establishing a contacting zone at said sub-collector zone of said pnp-transistor and a base zone of said npn-transistor prior to diffusing the emitter zones of said npn and pnp-transistors.

The disadvantages of the aforementioned diffusion method of the Donald process are overcome in that the thickness of the superficially disposed second partial layer of the epitaxial layer is so dimensioned that a layer of the second partial layer remaining unchanged in its conductivity type, will be left having a thickness corresponding to the desired base zone depth of the base zone of the pnp-transistor component after all temperature treatments connected with the diffusion of dopings have been carried out. Further, a contacting zone is established at the sub-collector zone of the pnp-transistor component as well as the base zone of the npn-transistor component, i.e. prior to diffusing the emitter zones of the two transistor components.

The above and other objects of the present invention will be more clearly understood from the following detailed description taken in conjunction with the accompanying drawings, in which:

DESCRIPTION OF THE PREFERRED EMBODIMENTS

Figure 1:
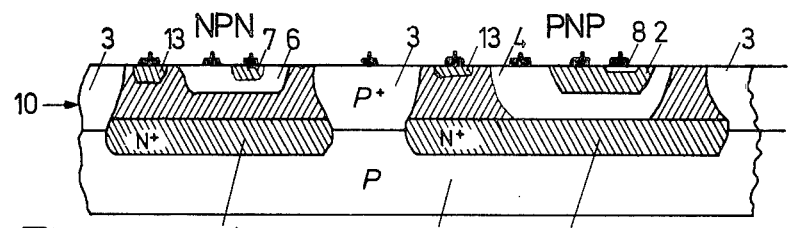
FIG. 1 is a cross-sectional view of a pair of complementary bipolar planar transistors manufactured in accordance with the aforementioned complementary Standard process.

FIG. 1 schematically shows the cross-sectional view of a pair of complementary planar transistor components manufactured in accordance with the aforementioned Standard process. On a p-conducting semiconductor body on which, subsequent to the planar diffusion of the "buried" intermediate layers 5 and 5', there is deposited an n-conducting epitaxial layer 10. This epitaxial layer 10 is used to drive in the insulating zones 3 in a known manner by the application of a second planar diffusion process. The base zones 2 and 6 and the emitter zones 7 and 8 are produced by employing another four planar diffusion steps. The relatively high-doped contacting zones 13 to which the contacts are attached, are manufactured in the course of producing the emitter zone 7 of the npn-planar transistor component.

It is to be noted that this Standard process for diffusing the zones requires six planar diffusion processes each with one photolithographic etch-masking process to be performed in the known manner. Since the safety margins or the yields are dependent upon the number of required photolithographic etch-masking processes, a reduction of this number would be desirable. Moreover, the planar diffusion method according to this Standard process has the disadvantages that owing to the three-fold diffusion of the pnp-transistor component, the latter has a relatively small surface breakdown voltage at the collector pn-junction, and that the absence of a buried intermediate layer of the same conductivity type as the collector zone, causes an increased collector series resistance having an unfavorable influence upon other electrical values of the pnp-transistor component depending thereon.

Figure 2:
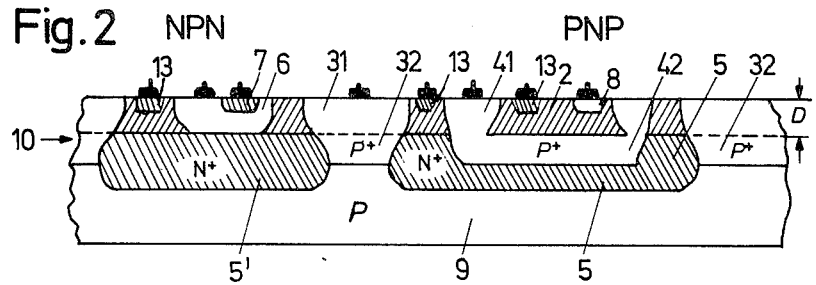
FIG. 2 is a cross-sectional view of a pair of complementary bipolar planar transistors manufactured in accordance with the known Stanford process.

An improvement in or relating to the number of necessary photolithographic etch-masking processes is provided by the Stanford First, resulting in a solid-state circuit according to FIG. 2. First as in the complementary Standard process, the two buried intermediate layers 5' and 5 are manufactured. Thereafter, however, by a second planar process, both the sub-collector zone 42 of the pnp-planar transistor component and a partial zone 32 of the insulating zone 3 are attached. This is followed by the deposition of the epitaxial layer 10. Subsequently thereto, by employing a third photolithographic etching process, the base zone 6 of the npn-transistor component is formed. By restricting the base zone 2 of the pnp-transistor component in a frame-like manner at the sub-collector zone 42, both a contacting zone 41 and the partial zone 31 of the insulating zone are diffused. A fourth planar diffusion process results in the contacting zones 13 and in the emitter zone 7 of the npn-planar transistor component. Finally, and by employing a further planar diffusion process, the emitter zone 8 of the pnp-planar transistor component is manufactured.

Accordingly, it is to be noted that the Stanford process requires one less photolithographic etching process than the planar process according to FIG. 1, and that a lower series resistance of the pnp-planar transistor component is achieved due to the sub-collector zone 42. The surface breakdown voltages of the collector pn-junctions of the planar transistor components, of course, are higher than in the case of the Standard process. This advantage, however, cannot be utilized because the high-doped sub-collector zone 42 is connected to a breakdown voltage of only a few volts. This has a rather favorable effect with respect to the manufacture of integrated resistors whose resistance zones are framed by insulating zones diffused together with the contacting zone 41 and which, for increasing the resistance values, are constricted by zones diffused together with the emitter zone 8 of the pnp-transistor component.

Figure 3:
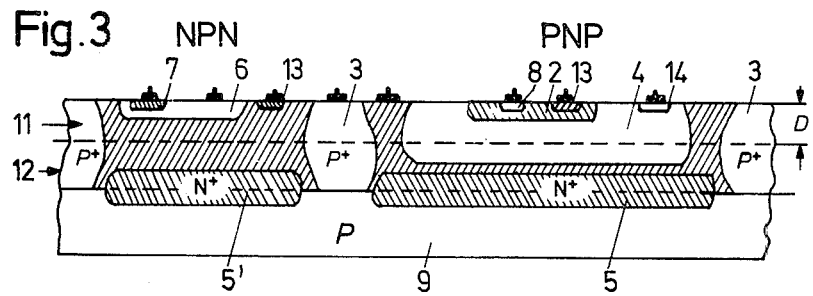
FIG. 3 is a cross-sectional view of a pair of complementary bipolar planar transistors manufactured in accordance with the Donald process.

The disadvantages of the Stanford process explained hereinbefore, are overcome by the planar diffusion method according to the Donald process. The process will now be explained with reference to FIG. 3. As in the Standard process of FIG. 1, all the buried intermediate layers 5 and 5' of increased doping concentration are first subjected to planar diffusion, whereupon, however, at first the partial layer 12 of the epitaxial layer 10 is deposited. Thereafter, a sub-insulating diffusion zone and a sub-collector diffusion zone are simultaneously inserted in the exposed surface of this epitaxial layer 12 at the point of producing the insulating zone and the sub-collector zone of the pnp-transistor component. The thickness of the subsequently deposited second partial layer 11 of the epitaxial layer and the further temperature processes are chosen in such a way that p-conducting dopings are diffused out of both the sub-collector diffusion zone and the sub-insulating diffusing zone. This results in an insulating zone 3 extending through the partial layers 11 and 12, as well as in a collector zone 4 which is restricted at the semiconductor surface. The base zones 2 and 6 are produced by third and fourth planar diffusion processes. Considering that the emitter zones of the complementary planar transistor structures are of a different conductivity type, two further planar diffusion processes are required subsequently thereto.

Accordingly, the Donald process requires one photolithographic etching process more than the Stanford process according to FIG. 2. Since the dopings of both the collector zone 4 and the buried intermediate layer only slightly diffuse into one another, as is indicated by the distance between the buried intermediate layer 5 and the collector zone 4 in FIG. 3, breakdown voltages will be obtained between these two zones 4 and 5 which are increased compared to those of the Stanford process according to FIG. 2. It has been found, however, that the tolerance values in the case of diffused resistors manufactured under more difficult circumstances and with relatively high values, are relatively large compared to those of the Stanford process according to FIG. 2.

These difficulties are overcome by the planar diffusion method of the process according to the invention which will now be explained with reference to FIGS. 4a–e.

Figure 4:
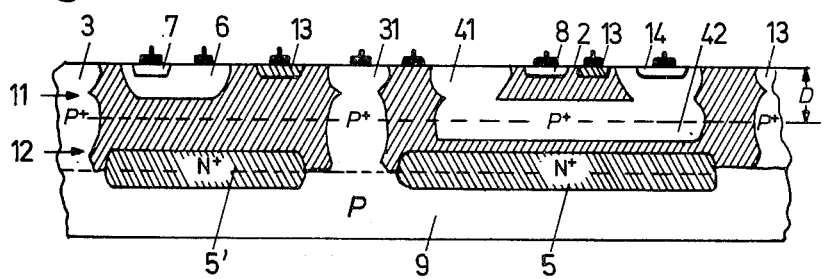
FIGS. 4a–e are cross-sectional views showing various steps in the fabrication of a pair of complementary bipolar planar transistors manufactured in accordance with the inventive planar diffusion method.
Figure 4A:
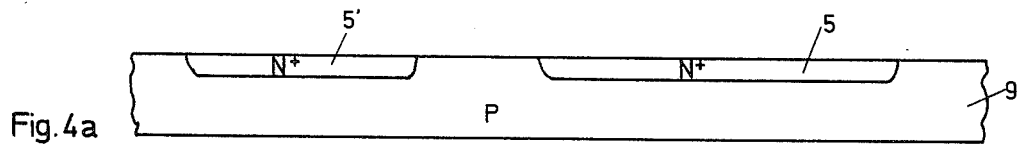
Figure 4B:
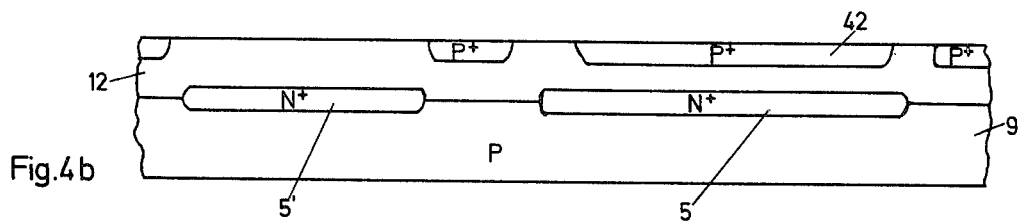
Figure 4C:
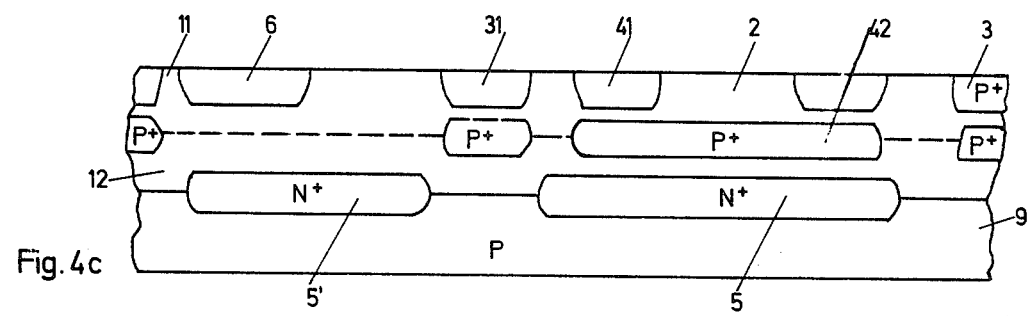
Figure 4D:
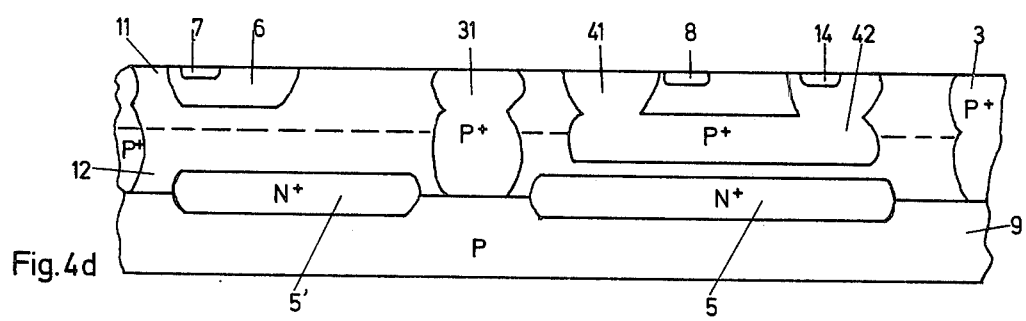
Figure 4E:
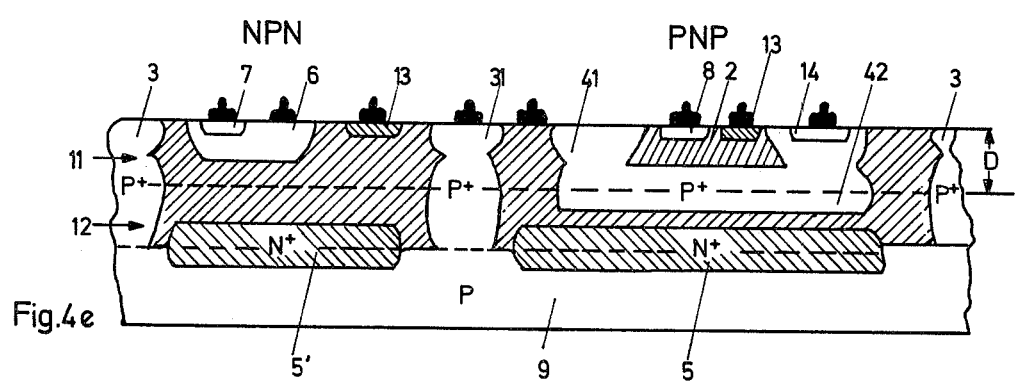

In the planar diffusion process according to the invention, the initial steps are similar to those of the Donald process, i.e. the intermediate layers 5 and 5' are manufactured, (FIG. 4a) the first partial layer 12 of the epitaxial layer is deposited and into this, superficially by a second planar diffusion process, both the sub-collector diffusion zone 42 and the sub-insulating diffusion zone are manufactured simultaneously (FIG. 4b). Thereafter, however, the second partial layer 11 is deposited epitaxially in such a thickness that in the course of the still necessary heat processes, an out-diffusion from these diffusion zones is effected only to such a depth, that a layer of the second partial layer 11 remaining unchanged, will be left over in a thickness corresponding to the desired base zone depth of the base zone 2 of the pnp-transistor. Upon deposition of the second partial layer 11, a partial zone 31 of the insulating zone, a frame-like contacting zone 41 restricting the base zone 2 of the pnp-transistor component, at the sub-collector zone 42, and the base zone 6 of the npn-transistor component are thereafter manufactured simultaneously (FIG. 4c). This is still followed by a fourth and fifth planar diffusion process for manufacturing the emitter zones 7 and 8 of the two planar transistor components. The collector-contacting zone 14 of the pnp-planar transistor component may be manufactured together with the emitter zone 8 of this planar transistor component (FIG. 4d). The final structure, including contact zones 13, is shown in FIG. 4e.

While the principles of the invention have been described above in connection with specific apparatus, it is to be clearly understood that this description is made only by way of example and not as a limitation on the scope of the invention.

What is claimed is:

1. A process for manufacturing a monolithic integrated circuit including at least one npn transistor and one pnp transistor comprising:
prediffusing into the surface of a substrate having a first conductivity type, two spaced buried regions of a second conductivity type;
epitaxially growing a first partial layer of said first conductivity type on said substrate;
simultaneously diffusing into said first partial epitaxial layer a sub-collector zone of said first conductivity type above one of said buried regions and a sub-insulating zone extending between said buried layers;

epitaxially growing a second partial layer on said first partial layer containing said sub-collector and sub-insulating zone, said sub-collector and sub-insulating zone outdiffusing into said second partial layer during the epitaxial growth;

simultaneously diffusing into said second partial layer an insulating zone which contacts said outdiffused insulating region, a base region above the other of said buried layers, said base region forming the base of said npn transistor, and frame-like contacting zones extending into said second partial layer and contacting said outdiffused sub-collector at its extremities, thus forming above said sub-collector and within said contacting zones a base region of said pnp transistor;

diffusing an emitter region into the base region of said npn transistor;

diffusing an emitter region into the base region of said pnp transistor.

* * * * *

UNITED STATES PATENT AND TRADEMARK OFFICE
CERTIFICATE OF CORRECTION

PATENT NO. : 3,956,035
DATED : May 11, 1976
INVENTOR(S) : Hans Herrmann

It is certified that error appears in the above-identified patent and that said Letters Patent are hereby corrected as shown below:

On the cover sheet Insert

-- (73) Assignee: ITT Industries, Inc., New York, N. Y. --.

Signed and Sealed this

Second Day of October 1979

[SEAL]

Attest:

RUTH C. MASON
Attesting Officer

LUTRELLE F. PARKER
Acting Commissioner of Patents and Trademarks